United States Patent [19]

Russell et al.

[11] Patent Number: 5,578,931
[45] Date of Patent: Nov. 26, 1996

[54] ARC SPECTRAL ANALYSIS SYSTEM

[75] Inventors: B. Don Russell; B. Michael Aucoin, both of College Station, Tex.

[73] Assignee: The Texas A & M University System, College Station, Tex.

[21] Appl. No.: 485,664

[22] Filed: Jun. 7, 1995

Related U.S. Application Data

[63] Continuation of Ser. No. 138,489, Oct. 15, 1993, abandoned.
[51] Int. Cl.⁶ .......................... G01R 31/08; G01R 19/00
[52] U.S. Cl. .......................................... 324/536; 364/483
[58] Field of Search ................................ 324/522, 536; 364/483; 361/42

[56] References Cited

U.S. PATENT DOCUMENTS

| | | |
|---|---|---|
| 3,308,345 | 3/1967 | Warrington . |
| 3,515,943 | 6/1970 | Warrington . |
| 4,281,386 | 7/1981 | Kondow et al. . |
| 4,297,738 | 10/1981 | Lee . |
| 4,313,146 | 1/1982 | Lee . |
| 4,347,542 | 8/1982 | Calhoun . |
| 4,347,738 | 9/1982 | Sanderson . |
| 4,466,071 | 8/1984 | Russell, Jr. . |
| 4,470,092 | 9/1984 | Lombardi . |
| 4,559,491 | 12/1985 | Saha . |
| 4,719,580 | 1/1988 | Nimmersjö . |
| 4,751,653 | 6/1988 | Junk et al. . |
| 4,752,886 | 6/1988 | Gareis . |
| 4,766,549 | 8/1988 | Schweitzer, III et al. . |
| 4,785,406 | 11/1988 | Lunderius et al. . |
| 4,795,983 | 1/1989 | Crockett et al. . |
| 4,800,509 | 1/1989 | Nimmersjö . |
| 4,812,995 | 3/1989 | Girgis et al. . |
| 4,851,782 | 7/1989 | Jeerings et al. . |
| 4,853,175 | 8/1989 | Book, Sr. . |
| 4,855,671 | 8/1989 | Fernandes . |
| 4,864,453 | 9/1989 | Bergman et al. . |
| 4,868,704 | 9/1989 | Cavero . |
| 4,871,971 | 10/1989 | Jeerings et al. . |
| 4,878,142 | 10/1989 | Bergman et al. . |
| 4,991,105 | 2/1991 | Pimental . |
| 5,003,486 | 3/1991 | Hendel . |

OTHER PUBLICATIONS

M. Aucoin, B. D. Russell, "Distribution High Impedance Fault Detection Utilizing High Frequency Current Components," *IEEE Transactions on Power Apparatus and Systems,* vol. PAS–101, No. 6, Jun., 1982, pp. 1596–1606.

M. Aucoin, B. D. Russell, "Detection of Distribution High Impedance Faults Using Burst Noise Signals Near 60 Hz," *IEEE Transactions on Power Delivery,* vol. PWRD–2, Apr., 1987, pp. 342–348.

B. D. Russell, B. M. Aucoin, T. J. Talley, "Detection of Arcing Faults on Distribution Feeders," EL–2757, Research Project 1285–3, Final Report, Dec. 1982.

Carl Lee Benner, "An Algorithm for Faulted Phase and Feeder Selection Under High Impedance Fault Conditions," A Thesis Submitted to the Graduate College of Texas A&M University, Aug., 1988.

Patrick Wayne Carswell, "The Detection of High Impedance Faults Using Random Fault Behavior," A Thesis Submitted to the Graduate College of Texas A&M University, Aug., 1988.

(List continued on next page.)

*Primary Examiner*—Maura K. Regan
*Attorney, Agent, or Firm*—Flehr, Hohbach, Test, Albritton & Herbert

[57] ABSTRACT

A method and apparatus are provided for detecting an arcing fault on a power line carrying a load current. The apparatus monitors and analyzes the load current to obtain frequency components. The analyzed load current is then compared to frequency components of an arcing fault model spectrum to determine whether an arcing fault exists on the power line. If the difference between the analyzed load current and the model spectrum is less than a selected error value, then an arcing fault exists on the power line. Otherwise, no arcing fault exists and conditions are normal on the line.

11 Claims, 3 Drawing Sheets

OTHER PUBLICATIONS

C. Benner, P. Carswell, B. D. Russell, "Improved Algorithm for Detecting Arcing Faults Using Random Fault Behavior," *Electric Power Systems Research*, vol. 17, 1989, pp. 49–56.

Load Extraction Fault Detection System, U.S. patent application Ser. No. 08/138,413, filed *Oct. 15, 1993*, invented by Russell et al.

Randomness Fault Detection System, U.S. patent application Serial No. 08/138,410, filed *Oct. 15, 1993*, invented by Russell et al.

Arc Burst Pattern Analysis Fault Detection System, U.S. patent application Serial No. 08/138,477, filed *Oct. 15, 1993*, invented by Russell et al.

Expert System For Detecting High Impedance Faults, U.S. patent application Serial No. 08/138,392, filed *Oct. 15, 1993*, invented by Russell et al.

Energy Analysis Fault Detection System, U.S. patent application Serial No. 08/138,146, filed *Oct. 15, 1993*, invented by Russell et al.

Load Analysis System For Fault Detection, U.S. patent application Serial No. 08/138,144, filed *Oct. 15, 1993*, invented by Russell et al.

"Detection of High Impedance Faults," EPRI Report, EL–2413, Prepared by Power Technologies, Inc., Jun. 1982.

"High Impedance Fault Detection Using Third Harmonic Current," EPRI Report, EL–2430, Prepared by Hughes Aircraft Company, Jun. 1982.

"The Characterization of High Impedance Faults," Prepared by PowerTech Labs, Inc., Canadian Electrical Association, Project 038 D 721, Jun. 1992.

M. Al–Dabbagh, R. Daoud, R. Coulter, "Improved Microprocessor Based Feeder Earth Fault Protection Using Pattern Recognition," Fourth International Conference on Developments in Power System Protection, Edinburgh, UK, Apr. 11–13, 1989.

M. Aucoin, "Status of High Impedance Fault Detection," *IEEE Transactions on Power Apparatus and Systems*, vol. PAS–104, No. 3, Mar. 1985, pp. 638–644.

B. M. Aucoin, J. Zeigler, B. D. Russell, "Feeder Protection and Monitoring System, Part I: Design, Implementation and Testing," *IEEE Transactions on Power Apparatus and Systems*, vol. PAS–104, No. 4, Apr. 1985, pp. 873–879.

B. M. Aucoin, J. Zeigler, B. D. Russell, "Feeder Protection and Monitoring System, Part II: Staged Fault Test Demonstration," *IEEE Transactions on Power Apparatus and Systems*, vol. PAS–104, No. 6, Jun. 1985, pp. 1456–1462.

H. J. Calhoun, M. T. Bishop, C. H. Eichler, R. E. Lee, "Development and Testing of an Electro–Mechanical Relay to Detect Fallen Distribution Conductors," *IEEE Transactions on Power Apparatus and Systems*, vol. PAS–101, No. 6, Jun. 1982, pp. 1643–1650.

J. Carr, "Detection of High Impedance Faults on Multi--Grounded Primary Distribution Systems," *IEEE Transactions on Power Apparatus and Systems*, vol. PAS–100, No. 4, Apr. 1981, pp. 2008–2016.

R. D. Christie, H. Zadehgol, M. M. Habib, "High Impedance Fault Detection in Low Voltage Networks," IEEE Power Engineering Society Summer Meeting, Seattle, Washington, Jul. 1992, IEEE Paper No. 92 SM 507–PWRD.

J. R. Dunki–Jacobs, "The Effects of Arcing Ground Faults on Low–Voltage System Design," *IEEE Transactions on Industry Applications*, vol. IA–8, No. 3, May/Jun. 1972, pp. 223–230.

S. D. Ebron, D. L. Lubkeman, M. White, "A Neural Network Approach to the Detection of Incipient Faults on Power Distribution Feeders," *IEEE Transactions on Power Delivery*, vol. 5, No. 2, Apr. 1990. pp. 905–912.

A. E. Emanuel, D. Cyganski, J. A. Orr, "High Impedance Fault Arcing on Sandy Soil in 15kV Distribution Feeders: Contributions to the Evaluation of the Low Frequency Spectrum," *IEEE Transactions on Power Delivery*, vol. 5, No. 2, Apr. 1990, pp. 676–684.

A. A. Girgis, W. Chang, E. B. Makram, "Analysis of High–Impedance Fault Generated Signals Using a Kalman Filtering Approach," *IEEE Transactions on Power Delivery*, vol. 5, No. 4, Nov. 1990, pp. 1714–1720.

C. Huang, H. Chu, M. Chen, "Algorithm Comparison for High Impedance Fault Detection Based on Staged Fault Test," *IEEE Transactions on Power Delivery*, vol. 3, Oct. 1988, pp. 1427–1434.

D. I. Jeerings, J. R. Linders, "A Practical Protective Relay for Down–Conductor Faults," *IEEE Transactions on Power Delivery*, vol. 6, Apr. 1991, pp. 565–571.

J. R. Linders, D. I. Jeerings, "Down–Conductor Detection: Theory and Practice," Texas A & M Conference for Protective Relay Engineers, College Station, Texas, Apr. 1993.

D. I. Jeerings, J. R. Linders, "Ground Resistance—Revisited," *IEEE Transactions on Power Delivery*, vol. PWRD–4, No. 2, Apr. 1989, pp. 949–956.

D. I. Jeerings, J. R. Linders, "Unique Aspects of Distribution System Harmonics Due to High Impedance Ground Faults," IEEE Transactions on Power Delivery, vol. 5, Apr. 1990, pp. 1086–1092.

A. T. Johns, P. Agrawal, "New Approach to Power Line Protection Based Upon the Detection of Fault Induced High Frequency Signals," *IEEE Proceedings, Part C, Generation, Transmission and Distribution*, vol. 137, No. 4, Jul. 1990, pp. 307–313.

R. H. Kaufmann, J. C. Page, "Arcing Fault Protection for a Low Voltage Power Distribution System—Nature of the Problem," *AIEE Transactions on Power Apparatus and Systems*, Jun. 1960, pp. 160–167.

C. J. Kim, B. D. Russell, "A Learning Method for Use in Intelligent Computer Relays for High Impedance Faults," *IEEE Transactions on Power Delivery*, vol. 6, No. 1, Jan. 1991, pp. 109–115.

C. J. Kim, B. D. Russell, K. Watson, "A Parameter–Based Process for Selecting High Impedance Fault Detection Techniques Using Decision Making Under Incomplete Knowledge," *IEEE Transactions on Power Delivery*, vol. 5, No. 3, Jul. 1990, pp. 1314–1320.

C. J. Kim, B. D. Russell, "Harmonic Behavior During Arcing Faults on Power Distribution Feeders," *Electric Power Systems Research*, vol. 14, No. 3, Jun. 1988, pp. 219–225.

C. J. Kim, B. D. Russell, "Classification of Faults and Switching Events by Inductive Reasoning and Expert System Methodology," *IEEE Transactions on Power Delivery*, vol. 4, Jul. 1990, pp. 1631–1637.

C. J. Kim, B. D. Russell, "High Impedance Fault Detection System Using an Adaptive Element Model," *IEE Proceedings–C*, vol. 140, No. 2, Mar. 1993, pp. 153–159.

W. H. Kwon, G. W. Lee, Y. M. Park, M. C. Yoon, M. H. Yoo, "High Impedance Fault Detection Utilizing Incremental Variance of Normalized Even Order Harmonic Power," *IEEE Transactions on Power Delivery*, vol. 6, Apr. 1991, pp. 557–563.

R. E. Lee, M. T. Bishop, "Performance Testing of the Ration Ground Relay on a Four–Wire Distribution Feeder," *IEEE Transactions on Power Apparatus and Systems*, vol. PAS–102, No. 9, Sep. 1983, pp. 2943–2948.

M. Narendorf, B. D. Russell, M. Aucoin, "Microcomputer Based Feeder Protection and Monitoring System—Utility Experience," *IEEE Transactions on Power Delivery*, vol. PWRD–2, No. 4, Oct. 1987, pp. 1046–1052.

R. M. Reedy, "Minimize the Public Risk of Downed Conductors," *Electrical World*, Sep. 1989, pp. S–36, 38, 40.

B. D. Russell, R. P. Chinchali, "A Digital Signal Processing Algorithm for Detecting Arcing Faults on Power Distribution Feeders," *IEEE Transactions on Power Delivery*, vol. PWRD–3, No. 4, Jan. 1989, pp. 132–140.

B. D. Russell, R. P. Chinchali, C. J. Kim, "Behaviour of Low Frequency Spectra During Arcing Fault and Switching Events," *IEEE Transactions on Power Delivery*, vol. 3, No. 4, Oct. 1988, pp. 1485–1491.

B. D. Russell, K. Mehta, R. P. Chinchali, "An Arcing Fault Detection Technique Using Low Frequency Current Components—Performance Evaluation Using Recorded Field Data," *IEEE Transactions on Power Delivery*, vol. PWRD–3, No. 4, Oct. 1988, pp. 1493–1500.

B. D. Russell, K. Watson, "Power Substation Automation using a Knowledge Based System —Justification and Preliminary Field Experiments," *IEEE Transactions on Power Delivery*, vol. PWRD–2, No. 4, Oct. 1987, pp. 1090–1095.

A. F. Sultan, G. W. Swift, D. J. Fedirchuk, "Detection of High Impedance Arcing Faults Using a Multi–Layer Perceptron," *IEEE Transactions on Power Delivery*, vol. 7, No. 4, Oct. 1992, pp. 1871–1877.

T. J. Talley, "Power Spectrum Estimates of High Frequency Noise Generated by High Impedance Arcing Faults on Distribution Systems," Master of Science Thesis, Texas A & M University, Dec. 1979.

A. R. van C. Warrington, *Protective Relays: Their Theory and Practice*, vol. 2, London: Chapman and Hall, 1969, pp. 340–347 only.

A. C. Westrom, A. P. Sakis Meliopoulos, G. J. Cokkinides, "Open Conductor Detector System" *IEEE Transactions on Power Delivery*, vol. 7, Jul. 1992, pp. 1643–1650.

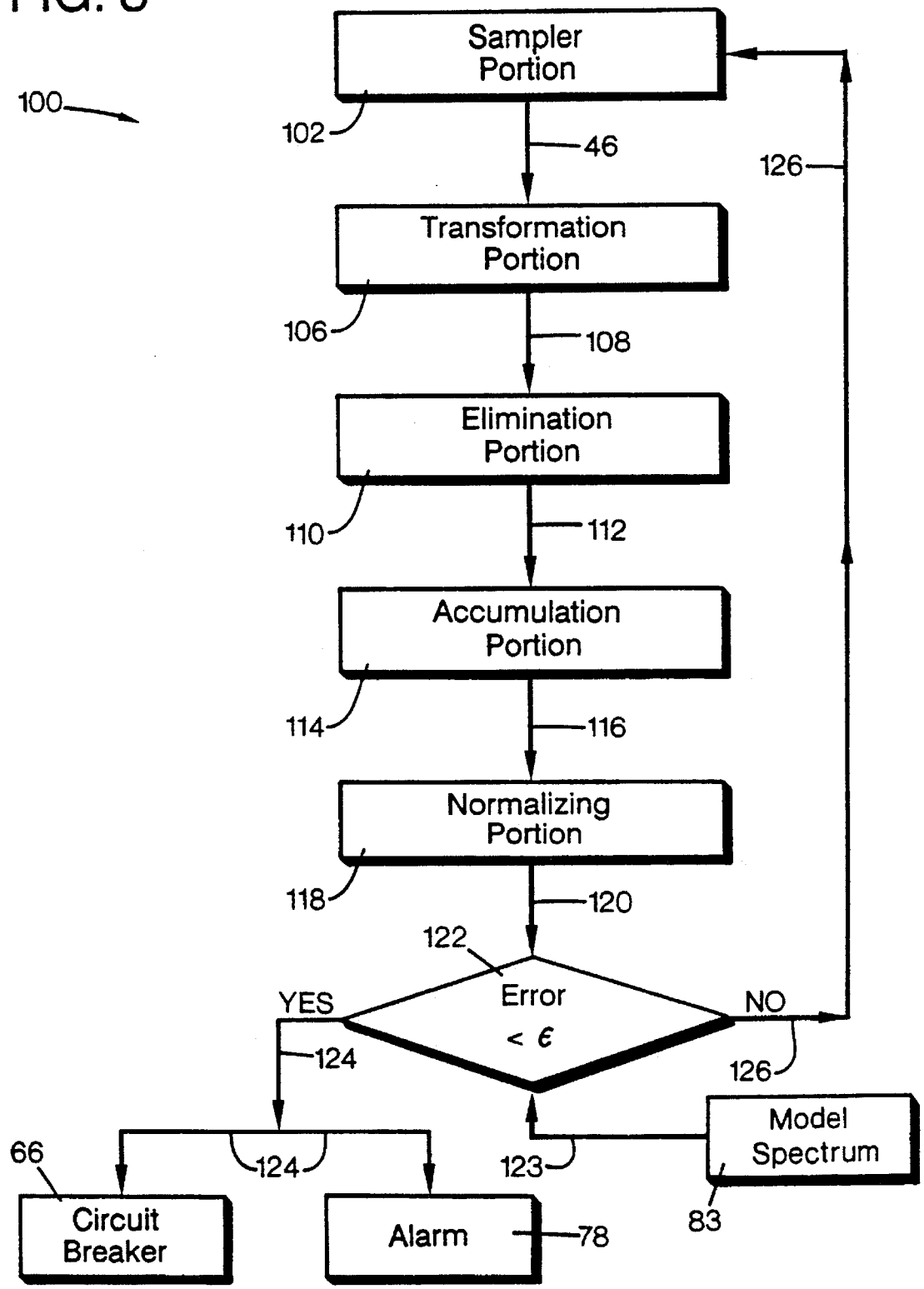

ARC SPECTRAL ANALYSIS SYSTEM

This is a continuation of application Ser. No. 08/138,489 filed Oct. 15, 1993, now abandoned.

BACKGROUND OF THE INVENTION

The present invention relates generally to an analysis system for use with an alternating current (AC) electric utility power system, and more particularly to an arc spectral shape analysis system for detecting high impedance, low current arcing faults on the power system. Arcing faults may be caused by, for example, downed, broken, tangled or dangling power lines, trees contacting the power lines, and various overcurrent fault situations.

Arcing faults are more difficult to detect than permanent overcurrent faults, which for instance, occur when a transformer fails. Conventional overcurrent protection devices have time delays which permit a temporary fault from de-energizing the power line. Only if the overcurrent fault persists does such a protection device de-energize the power line. Some arcing faults may initialize the timing circuits of the overcurrent protection devices but, by the end of the delay, the high impedance nature of the fault limits the fault current to a low value. An overcurrent protection device thus cannot distinguish this low fault current from the levels of current ordinarily drawn by customers, so the lines may remain energized even though a dangerous arcing fault exists on the power line.

Other methods of detecting arcing faults have focused on the high harmonic frequency content of the line current. These earlier methods compared the magnitude of line current harmonics with a predetermined reference magnitude. For instance, U.S. Pat. No. 3,308,345 to Warrington detects arcing faults by first filtering out the fundamental frequency (e.g. 60 Hertz in the United States and 50 Hertz in Europe) and its second and third harmonics. The magnitude of the remaining high harmonic frequencies, i.e., the fourth, fifth . . . harmonic frequencies, are then compared to a predetermined threshold magnitude value. Warrington measures the signals over a predetermined length of time. If the magnitude value of the high harmonic frequency components exceeds the reference magnitude value, the Warrington device produces a warning signal. The magnitude of normal harmonic components varies significantly depending on the connected load, making it extremely difficult to effectively set the threshold magnitude value for the Warrington device.

However, arcing often produces burst energy at low frequencies, particularly at non-harmonic frequencies near the fundamental frequency. The earlier methods failed to analyze the non-harmonic frequencies. Also, if the reference magnitude values were set too low, the earlier detection systems would often be too sensitive. As a result, the power lines would be de-energized although no hazardous fault existed on the line. Similarly, if the reference magnitude values were set too high, the lines would remain energized even though a dangerous fault existed on the power line.

Thus, a need exists for an improved high impedance fault detection system for electrical power transmission and distribution systems which is directed toward overcoming, and not susceptible to, these limitations and disadvantages.

SUMMARY OF THE INVENTION

The present invention encompasses an arcing fault detection system which detects arcing faults by analyzing non-harmonic frequencies. This approach minimizes unnecessary power service interruptions and outages.

According to one aspect of the present invention, a method is provided for analyzing arcing faults occurring on a power transmission or distribution system which includes a utility power line delivering power from an AC power generation system to customers. The method includes the step of providing an arcing fault model spectrum having frequency components which represent a typical arcing fault. In a monitoring step, a load current flowing over the line is monitored and representative current sample data are generated. In an analyzing step, the sample data are converted to discrete frequency components forming several sample spectra. In a determining step, the difference between the frequency components of the sample spectra and the frequency components of the model spectrum is determined. If the difference between the sample spectra and the model spectrum is less than a predetermined error value, then an arcing fault is indicated. Otherwise, no arcing fault is indicated and the power line is considered to be operating normally.

An overall object of the present invention is to provide an arcing fault detection system for detecting arcing faults that are too small to be properly recognized by conventional overcurrent protection systems.

Another object of the present invention is to provide an arcing fault detection system which is more reliable than the earlier systems.

The present invention relates to the above features and objects individually as well as collectively. These and other objects, features and advantages of the present invention will become apparent to those skilled in the art from the following description and drawings.

BRIEF DESCRIPTION OF THE DRAWINGS

FIG. 3 is a flow chart illustrating one manner of operating an arcing fault detection system of the present invention.

DETAILED DESCRIPTION OF A PREFERRED EMBODIMENT

Figure 1:
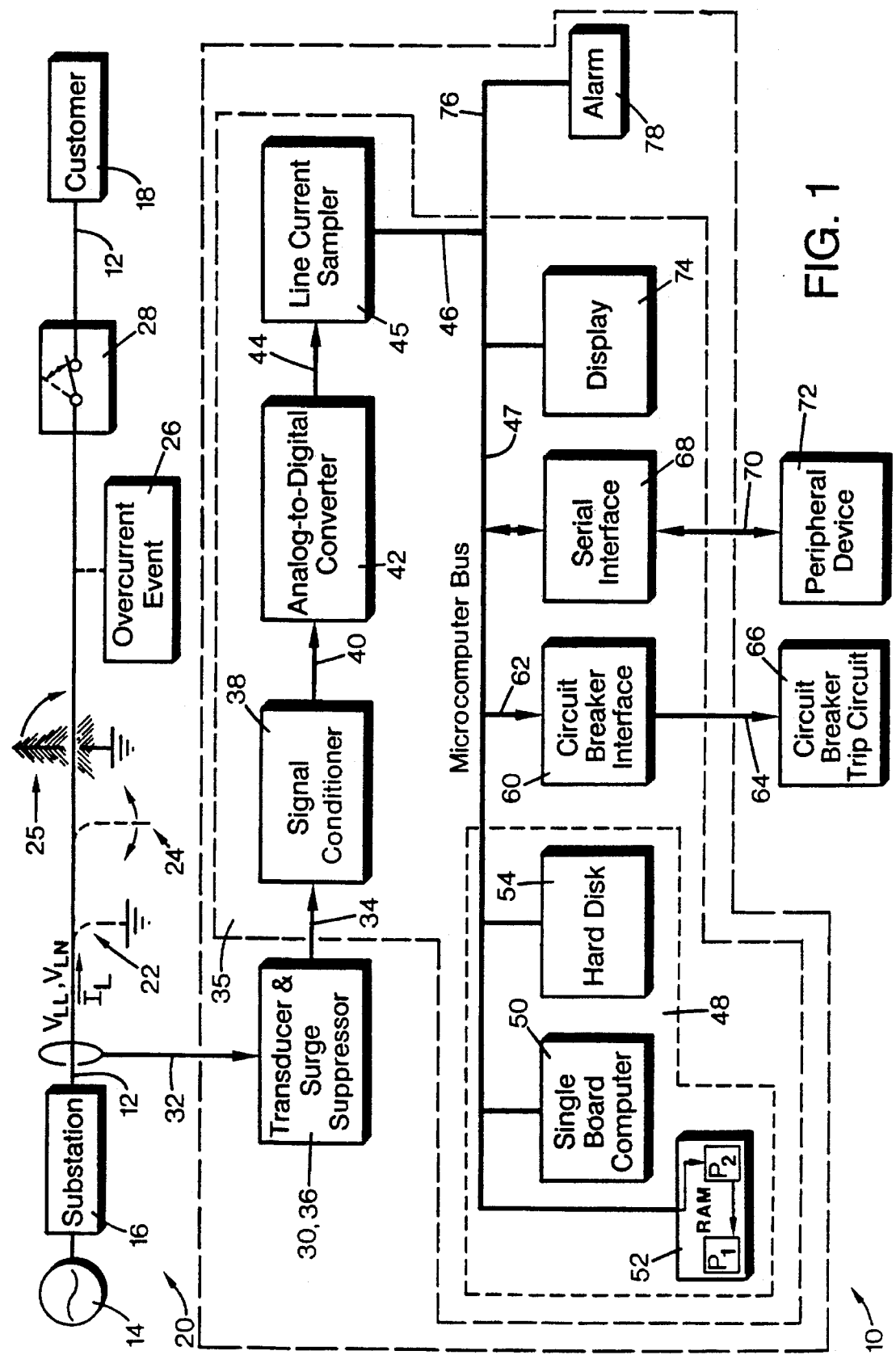
FIG. 1 is a schematic block diagram of one form of an arcing fault detection system of the present invention.

Referring to FIG. 1, an arc spectral analysis fault detector system or detector 10 constructed in accordance with the present invention is shown coupled to detect high impedance faults on a feeder line 12. The feeder 12 receives power from an AC power source, such as a generating station 14, through a substation 16. Other feeder lines (not shown) may also receive power from the generating station 14 and exit the substation 16. The feeder line 12 delivers power from the substation 16 to a variety of utility customers, such as customer 18.

Altogether, the generating station 14, substation 16, and feeder line 12 illustrate a portion of an electrical utility's power system 20. Most typical power systems generate and distribute power using a three phase system. Thus, the feeder line 12 delivers power over three phase lines, known as phases A, B, and C. The feeder 12 also has a neutral conductor. For convenience, power system 20 described herein is such a three phase system.

Between the substation 16 and the customer 18, the feeder line 12 may be subjected to a variety of different types of events, activities and faults. Some typical faults are illustrated in FIG. 1, specifically, an arcing fault caused by a downed conductor 22, a dangling conductor 24, or momentary contact of a tree 25 or other object with the feeder line 12. The system may also be subject to other disrupting events, such as an overcurrent event 26, and switching event 28 performed by a conventional recloser or the like.

The detector 10 includes a monitoring device, such as a sensor or transducer 30, coupled to feeder 12 as indicated schematically by line 32. The term "monitoring device" is broadly defined herein to include sensing devices, detecting devices, and any other equivalent form known to be interchangeable by those skilled in the art. The illustrated transducer 30 senses or monitors a line parameter indicative of the power flow through the line 12, such as voltage (line-to-line voltage $V_{LL}$ or line-to-neutral voltage $V_{LN}$), or load current $I_L$. For instance, in response to the monitored parameter, the transducer 30 produces a line parameter signal, here, a load current signal 34 that indicates the magnitude value of the current $I_L$ flowing in feeder 12. Typical frequencies which may be monitored range from zero Hertz (i.e., DC voltage or current levels) to 10 kilohertz, although higher frequencies may be used). The transducer 30 may be a conventional transducer or an equivalent device, such as multiple current transformers typically with one current transformer per phase plus one on the neutral conductor of the feeder line 12.

The detector 10 may also include surge protection, for example, a surge suppressor or protector 36. The surge protector 36 may be supplied either with the transducer 30, as illustrated, or as a separate component. The surge protector 36 protects the detector 10 from power surges on the feeder 12, such as those caused by lightning strikes or the like.

A controller 35 receives the load current signal 34 from transducer 30. The controller 35 may include a signal conditioner 38 for filtering and amplifying the load current signal 34 to provide a clean conditioned load current signal 40. Preferably, the signal conditioner 38 includes a low-pass filter suitable for satisfying the Nyquist criteria of sampling, known to those skilled in the art.

The signal conditioner 38 may also amplify the load current signal 34 for the appropriate gain required by an analog-to-digital (A/D) converter 42. For example, the current flowing on the power system 20 has a dynamic range of 10 to 10,000 Amps, so the signal conditioner 38 appropriately scales these signals for conversion by the A/D converter 42 from an analog signal 40 into a digital load current signal 44.

When transducer 30 is an analog device, the controller 35 includes the illustrated discrete A/D converter 42. The transducer 30 may also be implemented in a digital device which incorporates the signal conditioning function of conditioner 38 and the analog-to-digital conversion function of the A/D converter 42.

Additionally, the controller 35 may include a line current frequency sampling device or high frequency sampler 45. The illustrated sampler 45 samples the digitized current signal 44 at selected intervals to provide an accurate representation of the load level due to rapidly changing conditions, such as during arcing faults.

In the illustrated embodiment, the sampler 45 provides a sampler signal 46 corresponding to the sampled line current values. The sampler signal 46 is supplied via a microcomputer bus 47 to a computing device, such as a microcomputer system 48. The sampler 45 may measure the magnitude of line current in both the fundamental and nonfundamental (noise) frequency ranges. Alternatively, the high frequency sampling function may also be conducted by microcomputer system 48 (see FIG. 2). Other details of the sampling process are described below. It is apparent to those skilled in the art that other variations of these sensing and sampling functions are also possible. For instance, line-to-line or line-to-neutral voltages may be monitored, sampled and analyzed instead of, or in addition to, the line current $I_L$.

The illustrated microcomputer system 48 has a computer, such as a single-board computer 50, coupled with a memory device, such as a random-access memory 52, and a data storage device, such as a hard disk 54. A suitable microcomputer system 48 may include a conventional personal computer or any other equivalent device known to be interchangeable by those skilled in the art.

Controller 35 has a circuit breaker interface 60 for receiving a trip command signal 62 from the computer 50 via bus 47. In response to the trip command signal 62, the interface 60 sends a trip signal 64 to a circuit breaker trip circuit 66. The trip circuit 66 drives a circuit breaker (not shown) located at substation 16 to de-energize feeder 12.

Controller 35 may include an optional serial interface 68, such as a modem for sending and receiving a peripheral device signal 70 over a telephone network. The interface 68 may communicate with an external peripheral device 72, such as a remotely located power distribution control center. In some systems, peripheral device 72 may provide a remote input to the detection system 10 via serial interface 68, for example, to override previous programming of the detector 10, such as initial settings for a frequency sampling rate, a sampling time period, and the like.

Controller 35 may also include an output device, such as a visual display device 74, or a printer. Preferably, the output display provides a visual indication of the status of system 10, feeder 12, and previous operating conditions of the feeder. The controller 35 may also provide an alarm signal 76 via bus 47 to an alarm 78 which may be visual, audible, or both.

Operation

In operation, the high frequency sampler 45 samples the digital load current signal 44 at a frequency higher than the fundamental frequency of the load current $I_L$ flowing through feeder 12. For example, when the fundamental power system frequency is 60 Hertz, sampler 45 may sample the current at a frequency sampling rate of about 1,920 Hertz, which is 32 times higher than the fundamental frequency. It is apparent that other fundamental frequencies such as 50 Hz, may be used. It is also apparent that other sampling frequencies may be used, but preferably the frequency of the sampling rate is higher than the fundamental frequency to provide an adequate number of samples per cycle of the fundamental frequency.

To statistically improve the accuracy of the sampling process further, the sampling may occur over a time period of five seconds or more. Other time periods ranging from less than one second to up to several minutes may also be used. For example, at the illustrated sampling frequency of 1,920 Hertz, sampler 45 provides 32 data samples for each cycle (1/60th of a second) for the power system 20 having a 60 Hertz fundamental frequency. During a five second time period, 9,600 samples are generated. These data samples are sent via bus 47 to microcomputer system 48 for processing in accordance with the present invention.

Load Current Data Processing

In overview, the preferred embodiment of the present invention also illustrates a method of detecting arcing faults on an alternating current distribution line, such as feeder 12 of the utility power system 20. The detector 10 continuously monitors cyclic load currents on the feeder 12. During an arcing fault on the feeder 12, the current drawn by the fault typically is not continuous or stable. Rather, the magnitude of the load current varies in short bursts, typically on a half-cycle basis. In other words, the magnitude of the current drawn during the first half-cycle of the power system frequency differs from the current drawn during the second half-cycle, because the resistance of the current path of the arc varies. This varying resistance is caused by the presence of ionized gases, soil particles in the air, smoke and the like, generated by the previous half cycle(s) of the arc.

Figure 2:
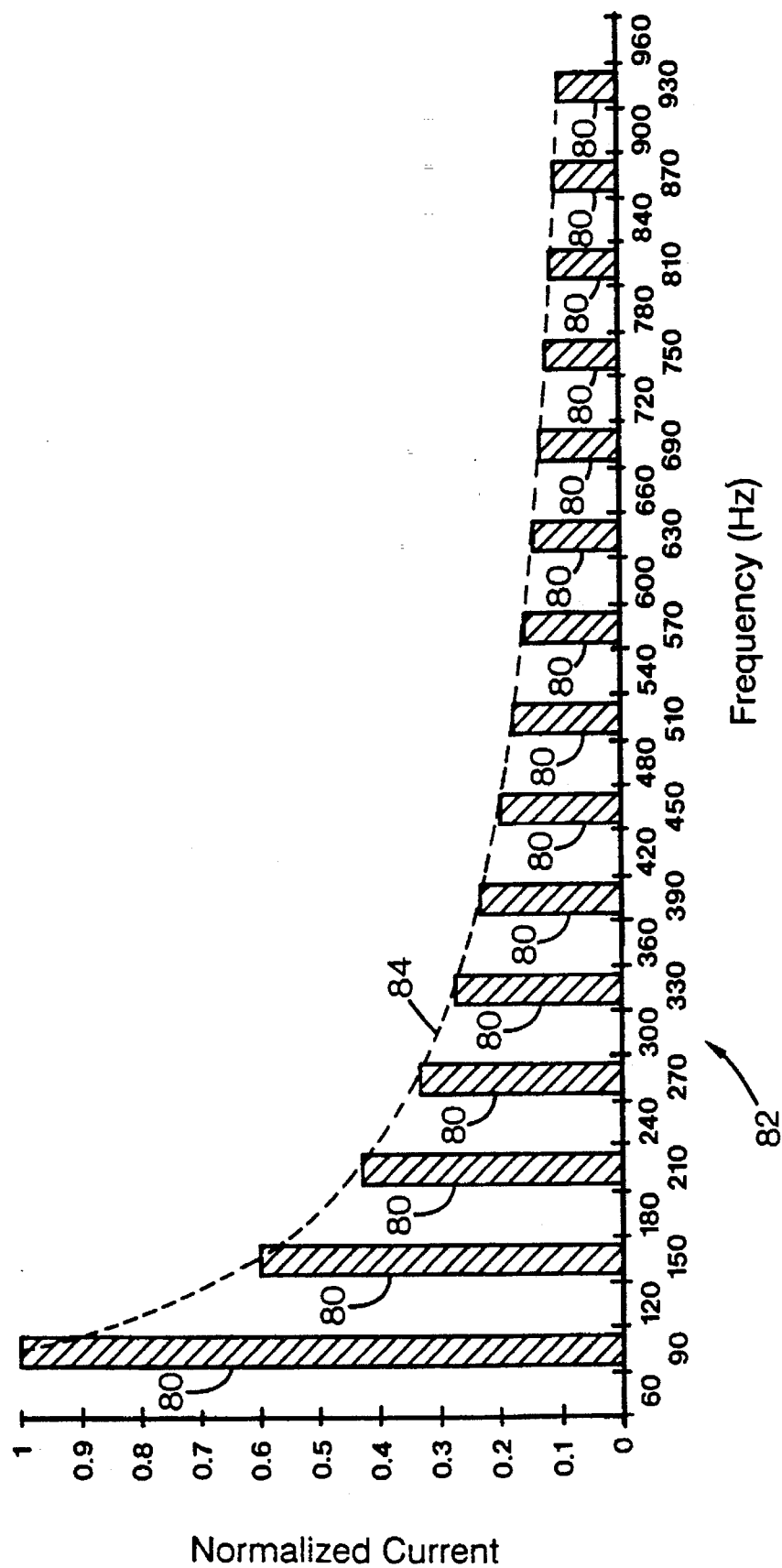
FIG. 2 is a graph of one form of a frequency component sample spectrum of the present invention and a model curve illustrating a typical arcing fault.

In general, the detector 10 samples and transforms AC current samples 32 drawn from the feeder 12 into normalized Discrete Fourier Transform (DFT) frequency components 80 (FIG. 3) which together form an arcing spectra and compares the shape of each sample spectrum 82 with the shape of an arcing fault model spectrum or curve 84 as shown in FIG. 2. A spectrum may be defined as a continuous curve or a plurality of discrete frequency components. If the accumulated difference between each normalized sample spectrum 82 and the arcing fault model curve 84 is less than a predetermined error value $\epsilon$, then arcing is indicated on the power line. Otherwise, arcing is not indicated.

Referring to FIG. 3, a method of processing the sampled current data is schematically illustrated in a flow-chart 100 as steps or portions. A portion is defined broadly herein as a processing step conducted by hardware, software or combinations thereof known to those skilled in the art. FIG. 3 illustrates an embodiment of detector 10 where the sampling function is accomplished by the microcomputer 48, rather than the sampler 45 shown in FIG. 1.

In a sampler portion 102 of computer program for microcomputer 48, the AC data samples of the load current $I_l$ are obtained. It is apparent that the functions performed by sampler portion 102 may also be implemented by sampler 45. The sampler portion 102 issues the sampler signal 46 to a conversion or transformation portion 106 which converts or transforms the data samples into sample spectra such as spectra 108 of FIG. 3 shown in FIG. 2 as sample spectrum 82 containing DFT frequency components 80. The conversion portion 106 receives the sampler signal 46, and in response thereto converts the data samples to the frequency components 80 shown in FIG. 2, preferably through the use of DFT equations. Other equations such as Fast Fourier Transform (FFT) equations, may also be used to transform the data samples 80 into frequency components.

While the DFT equation may be used for any part of a frequency spectrum, the equation is, preferably, but not necessarily, applied to frequency components below a selected frequency limit, for example, 960 Hertz. In this example, the equation transforms the data samples into the discrete frequency components 80 in 30 Hertz intervals (FIG. 3). Other intervals ranging from less than one Hertz to over 100 Hertz may also be used. The illustrated DFT equation transforms the data samples to the discrete frequency components 80 ranging from, for example, 30, 60, 90, 120, . . . 930 and 960 Hertz. The frequency components may range from less than one Hertz to several hundred thousand Hertz.

As mentioned earlier, 32 data samples are provided by sampler 102 for each cycle of the fundamental frequency. The DFT equation preferably uses data samples generated over two cycles because Fourier transform techniques work well with 64 samples since 64 is a number of the form $2^n$ where n is an integer. The advantages of the form $2^n$ in Fourier transform equations are well-known to those skilled in the art, although other transformation equations may also be used with other desirable numbers of data samples, other than 32, being generated by sampler 102. Moreover, these data samples generated over a single cycle or more than two cycles may also be used.

Because each sample spectrum 82 represents data samples measured over two frequency cycles, 30 sample spectra are developed per second (when the fundamental frequency is 60 Hertz). Therefore, each sample spectrum 82 is based on 64 data samples. Consequently, 150 sample spectra are generated over a five second measuring time period. After the transformation of each sample spectrum 82 is completed, transformation portion 106 issues a transformed signal 108 to an elimination portion 110.

To improve the efficiency of the detector 10, the fundamental frequency (60 Hertz) and its harmonics (120 Hertz, 180 Hertz, etc.) are preferably, but not necessarily, removed from each sample spectrum 82 by the elimination portion 110. The elimination portion 110 may be implemented by a notch filter or the like, known to those skilled in the art. It has been found that the fundamental and harmonic normal load components of the measured current tend to bias the desired results. These results are biased because the fundamental frequency components are often unpredictable and much larger in magnitude than the non-harmonic components. However, it is apparent that microcomputer system 48 may process each sample spectrum 82 without first removing the fundamental and harmonic frequency components.

Thus, only the non-harmonic frequency components 80, those between the harmonics, remain for further analysis. For example, if the fundamental frequency is 60 Hertz, the discrete frequency components ranging from 60, 120, 180, 240, . . . 960 Hertz may be removed. In this manner, the non-harmonic frequency components ranging from 30, 90, 150 . . . 930 Hertz remain for analysis by the microcomputer system 48.

It is apparent that the invention is not limited to a 60 Hertz fundamental frequency. If, for example, the fundamental frequency is 50 Hertz, the discrete frequency components 50, 100, 150, 200 Hertz may be removed from each sample spectrum 82 by elimination portion 110. After the fundamental frequency component and its harmonics have been removed, elimination portion 110 issues a non-harmonic component signal 112 to an accumulation portion 114.

An accumulation portion 114 receives the non-harmonic signal 112 and accumulates the magnitude values of each separate non-harmonic frequency component (that is, the current magnitude value for each discrete frequency component 80 up to 930 Hertz) from each of the 150 DFT sample spectrum 82. In equation form, the accumulations of the frequency components 80 may be described as follows:

$$\text{Sum } [j] = \Sigma_{k=1..150} DFT [j][k]$$

for each j=30, 90, . . . , 930 Hertz

In other words, Sum [30](i.e. j=30) represents the total added value of all the 30 Hertz frequency components 80 from each of the 150 DFT sample spectra. The (j) variable indicates the frequency component 80 in each sample spectrum 82 and the variable (k) indicates the sample spectrum ranging from 1 . . . 150. In this manner, Sum [90](i.e. j=90) represents the sum value of all the 90 Hertz components from the 150 spectra (k=1 . . . 150) and Sum [930](i.e. j=930) is the total value of all the 930 Hertz frequency components. Sum [60] and all its harmonics are, of course, not included because the 60 Hertz fundamental frequency and its harmonic components have been removed by elimination portion 110. The accumulation portion 114 provides an output of these accumulated values as an accumulated spectra signal 116.

Preferably, the accumulated spectra signal 116 is received by a normalizing portion 118 which preferably normalizes the sum, Sum [j], of each specific frequency component about a selected frequency component value, such as, the 30 Hertz frequency component. The sample frequency components are normalized to properly scale the data samples so that data samples from different arcing fault events may be compared to the model curve 84 in a meaningful manner. The normalization of spectra signal 116 may be described as:

Norm [j]=Sum [j]/Sum [30]

for each j=30, 90, . . . , 930 Hertz

In this equation, the value of each Sum [j] frequency component is divided by the value of the Sum [30] component. As is apparent, the normalized value Norm [j] is always 1 when j=30 because Sum [j] equals Sum [30]. The normalized value of Norm [90] is the value of the sum of all the 90 Hertz frequency components, Sum [90], divided by the value of the sum of all the 30 Hertz frequency components, Sum [30]. The frequency may be normalized to other frequency components such as 60 or 90 Hertz, or not normalized at all.

Other techniques may be used by normalizing portion 118 for normalizing the frequency components of the accumulated spectra signal 116. However, most other known methods of obtaining this estimate are much more computationally intense, requiring fast and expensive computers.

Normalizing portion 118 then issues a normalized spectra signal 120 to a comparator portion 122. One particular advantage of using the normalized spectra is that its shape can be compared to the shape of the 1/f arcing fault model spectrum 84 (FIG. 2) to determine whether an arcing fault exists on the power line 12.

The current drawn during an arcing fault may be modelled roughly by a series of typical variable-width pulses or frequency components. The average spectrum of a series of these pulses results in the model spectrum 84. FIG. 2 shows the model spectrum 84 for frequencies up to, but not including, 960 Hertz. As is apparent, other frequency ranges may be used. Data samples taken during an arcing fault, which have been transformed to normalized discrete frequency components, tend to follow the shape of the model spectrum 84. Frequency spectra measured empirically during arcing faults on power systems have verified that the shape of the model spectrum 84 is applicable up to 10,000 Hertz.

The illustrated model spectrum 84 includes frequency components 80 for frequencies up to 930 Hertz. As mentioned earlier, the frequency component for the fundamental frequency 60 Hertz, and its harmonics, are removed by elimination portion 110 because they tend to bias the result. The model spectrum 84 may be described as:

Model [j]=30.0/j for each j=30, 90, . . . , 930 Hertz

Since the normalizing portion 118 normalized the components about the value of the 30 Hertz component, the value of Model [30] is one (for j=30, 30/j=1). In the same way, the value of Model [150] is ⅕ and the value of Model [930] is 1/31. The values of the frequency components are preferably, but not necessarily, connected by a continuous line to form the model spectrum 84 illustrated in FIG. 2. The model spectrum 84 may be stored on the hard disk 54 for retrieval and updating by computer 50 via bus 47 as required. Alternatively, the model spectrum 84 may be stored elsewhere, or generated whenever needed. A model spectrum signal 123, representing spectrum 84, is supplied to the comparator portion 122 from the storage location or generation portion where the model spectrum 84 is maintained.

The comparing portion 122 receives the model spectrum signal 123 and the normalized signal 120. In response to these signals, comparing portion 122 calculates the difference between each of the normalized frequency components Norm [j] and the corresponding portion of the model spectrum 84 to determine if an arcing fault exists on the power line 12. The calculations of the error value may be described in equation form as:

$$\text{Error} = \Sigma_{j=30,90\ldots930}|\text{Norm}[j] - \text{model}[j]|$$
$$= \Sigma_{j=30,90\ldots930}|(\text{Sum}[j]/\text{Sum}[30]) - 30/j|$$

The absolute difference between the normalized frequency components Norm [j] of each sample spectrum 82 and the normalized frequency components of model spectrum 84 is first calculated by the comparing portion 122. The differences are then accumulated to arrive at a total error value ("Error" in FIG. 2) for all the frequency components.

The comparing portion 122 then compares the total error value to a selected acceptable error limit ($\epsilon$). The error limit ($\epsilon$) is preferably stored in the comparing portion 122, but it can also be stored in RAM 52 or on hard disk 54 for retrieval when needed.

If the error value is less than e, then an arcing fault on feeder line 12 is indicated as a YES signal 124 is generated by comparing portion 122. The YES signal 124 may be delivered to, for example, the circuit breaker 66 to de-energize feeder 12 and/or the alarm 78.

If the calculated error is the same as or more than $\epsilon$, then arcing is not indicated and a normal or NO signal 126 is generated, so feeder 12 remains energized. The NO signal 126 travels from the comparing portion 122 back to sampler portion 102 as a signal to continue or begin generating the next string of data samples for processing. Thus, the method is continuously repeated until an arcing fault is detected. After detection, the process may continue, or a separate initializing signal may be used to restart operation of the detector 10.

Conclusion

Having illustrated and described the principles of our invention with respect to a preferred embodiment, it should be apparent to those skilled in the art that our invention may be modified in arrangement and detail without departing from such principles.

For example, while the illustrated embodiment has been implemented in computer software, or discussed in terms of devices, it is apparent that structural equivalents of the various components and devices may be substituted as known to those skilled in the art to perform the same functions. Furthermore, while various hardware devices, such as the transducer, sampler and microcomputer system are illustrated, it is apparent that other devices known to be interchangeable by those skilled in the art may be substituted. We claim all such modifications falling within the scope and spirit of the following claims.

We claim:

1. A method of detecting arcing faults occurring on a power line, comprising the steps of:

using a pre-determined arcing fault signal model, which characterizes the behavior of an arcing fault;

monitoring a load signal parameter indicative of the power flowing through said power line;

deriving a frequency spectrum of sample frequency components based on said load signal parameter; and comparing individual components of said spectrum of sample frequency components to corresponding frequency values of said arcing fault signal model to determine whether an arcing fault exists on said power line.

2. The method of claim 1 wherein said monitoring step includes the step of sampling a load current signal to form a sampled load current signal.

3. The method of claim 2 wherein said deriving step includes the step of converting said sampled load current signal into non-harmonic frequency components.

4. The method of claim 3 wherein said non-harmonic frequency components are discrete.

5. The method of claim 1 wherein said monitoring step includes the step of sampling a load voltage signal to form a sampled load voltage signal.

6. The method of claim 5 wherein said deriving step includes the step of converting said sampled load voltage signal to non-harmonic frequency components.

7. The method of claim 1 wherein said deriving step includes the steps of:

converting said load signal parameter into load signal frequency components; and removing fundamental frequency components and harmonic frequency components from said load signal frequency components to form said frequency spectrum of sample frequency components.

8. The method of claim 7 wherein said converting step includes the step of converting said load signal parameter into load signal frequency components using discrete Fourier transforms.

9. The method of claim 1 wherein said comparing step produces a set of difference signals indicative of the differences between said individual components of said spectrum of sample frequency components and said corresponding frequency values of said arcing fault signal model.

10. The method of claim 9 further comprising the step of providing an alarm signal if said set of difference signals is more than a selected value.

11. The method of claim 10 further comprising the step of providing a normal signal if said set of difference signals is less than said selected value.

* * * * *